(12) United States Patent
Cheng et al.

(10) Patent No.: US 10,167,981 B2
(45) Date of Patent: Jan. 1, 2019

(54) EXTENSION-TYPE CABLE TIE FRAME FOR POWER CABLE

(71) Applicant: CYBER POWER SYSTEMS, INC., Taipei (TW)

(72) Inventors: Hsiung-Kuei Cheng, Taipei (TW); Huang-Chih Chen, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 4 days.

(21) Appl. No.: 15/367,798

(22) Filed: Dec. 2, 2016

(65) Prior Publication Data

US 2017/0184224 A1 Jun. 29, 2017

(30) Foreign Application Priority Data

Dec. 23, 2015 (CN) .......................... 2015 1 0977091

(51) Int. Cl.
*F16L 3/00* (2006.01)
*F16L 3/223* (2006.01)
*F16L 3/137* (2006.01)
*H05K 7/14* (2006.01)

(52) U.S. Cl.
CPC .............. *F16L 3/2235* (2013.01); *F16L 3/137* (2013.01); *H05K 7/14* (2013.01); *H05K 7/1491* (2013.01); *H05K 7/1492* (2013.01)

(58) Field of Classification Search
CPC ........... F16L 3/2235; F16L 3/137; F16L 3/10; H05K 7/14; H05K 7/1491; H05K 7/1492; A47F 5/00; G02B 6/00; H02G 3/00

USPC ......... 248/68.1, 49, 65, 74.3; 174/135, 68.3, 174/99 R; 211/26; 361/826; 379/328; 439/719, 540.1

See application file for complete search history.

(56) References Cited

U.S. PATENT DOCUMENTS

| | | | |
|---|---|---|---|
| 5,921,402 A | 7/1999 | Magenheimer | |
| 6,170,784 B1 * | 1/2001 | MacDonald | H05K 7/1448 211/26 |
| 6,305,556 B1 | 10/2001 | Mayer | |
| 6,396,992 B1 * | 5/2002 | Debal | H04Q 1/13 385/135 |
| 6,501,020 B2 * | 12/2002 | Grant | H02G 3/0456 174/50 |
| 6,568,542 B1 * | 5/2003 | Chen | H04Q 1/06 211/26 |

(Continued)

*Primary Examiner* — Nkeisha Smith
(74) *Attorney, Agent, or Firm* — Bacon & Thomas, PLLC (57) ABSTRACT

An extension-type frame for power cable tie, the extension-type frame comprises a first cable frame having a first plane surface, the first plane surface has a plurality of first protruding rings, each of the first protruding rings can form a first cable tie hole; a second cable frame having a second plane surface, the second plane surface has a plurality of second cable tie holes; wherein a plurality of edges of the second cable frame respectively insert into a plurality of rail spaces of the first cable frame, the first and second cable frames can slide each other, the first protruding rings of the first plane surface are located above the second cable tie holes of the second plane surface, thereby preventing interference between the second cable tie holes of the second plane surface and the first cable tie holes of the first plane surface, and therefore the second plane surface can adjust the available quantity of the second cable tie holes.

7 Claims, 14 Drawing Sheets

(56) References Cited

U.S. PATENT DOCUMENTS

| | | | | |
|---|---|---|---|---|
| 6,679,722 B1* | 1/2004 | Pulizzi | ............... | H01R 13/562 |
| | | | | 439/451 |
| 6,818,834 B1* | 11/2004 | Lin | ............... | H02G 3/32 |
| | | | | 174/135 |
| 7,091,418 B1* | 8/2006 | Clark | ............... | G02B 6/4452 |
| | | | | 174/135 |
| 7,510,421 B2* | 3/2009 | Fransen | ............... | H01R 9/2416 |
| | | | | 439/449 |
| 7,753,319 B1* | 7/2010 | Updegrove | ............... | H02G 3/30 |
| | | | | 248/558 |
| 8,018,725 B2* | 9/2011 | Pepe | ............... | H04Q 1/06 |
| | | | | 361/725 |
| 8,093,499 B2* | 1/2012 | Hoffer | ............... | H02G 3/0456 |
| | | | | 174/68.1 |
| 8,203,854 B2* | 6/2012 | Tsai | ............... | F16M 13/02 |
| | | | | 248/327 |
| 8,464,984 B2* | 6/2013 | Laursen | ............... | H02G 3/30 |
| | | | | 211/26 |
| 8,816,199 B1* | 8/2014 | French | ............... | H05K 7/1491 |
| | | | | 174/59 |
| 9,042,702 B2* | 5/2015 | Rodriguez | ............... | G02B 6/36 |
| | | | | 385/134 |
| 9,144,174 B2* | 9/2015 | Chen | ............... | H05K 7/1421 |
| 9,310,013 B2* | 4/2016 | Komaro | ............... | F16L 3/127 |
| 9,429,251 B1* | 8/2016 | Lin | ............... | F16M 13/02 |
| 2004/0035983 A1* | 2/2004 | Simonson | ............... | H02G 15/007 |
| | | | | 248/49 |
| 2014/0001315 A1* | 1/2014 | Mcneal | ............... | F16L 3/00 |
| | | | | 248/67.7 |

* cited by examiner

EXTENSION-TYPE CABLE TIE FRAME FOR POWER CABLE

BACKGROUND OF THE INVENTION

1. Field of the Invention

The invention relates to a frame of cable tie, and more particularly to an extension-type frame for power cable tie, the extension-type frame has a first cable frame and a second cable frame, the first cable frame uses a plurality of first protruding rings to form a plurality of a first cable tie holes, the second cable frame has a plurality of a second cable tie holes, the first and second cable frames can slide each other.

2. Description of Related Art

A first prior-art is disclosed in U.S. Pat. No. 5,921,402, the first prior-art disclosed a bracket can slide on two support rails of an elongate member, therefore the bracket can adjust a distance between neighboring hooks. But the length of the elongate member is consistent, the elongate member can not adjust its length according to apparatus requirement. Moreover, the hooks can collect to fix a plurality of cables, but the hooks can not form identifiable paths of power cables and divided paths of power cables. It is difficult for a user to find out a power supply input terminal of each cable and a power output terminal of each cable. Furthermore, if the power cables of undivided path are twisted together, that will not easy to untie the power cables when any cable needs to repair or replace it. Thus, there is a requirement of improvement for the first prior-art.

A second prior-art is disclosed in U.S. Pat. No. 6,305,556, the second prior-art disclosed a cable management arm can fold and slide on a rack, and therefore the cable management arm can change the folding position. The cable management arm can collect to fix a plurality of cables, but the cable management arm can not form an identifiable path of power cable and a divided path of power cable. It is difficult for a user to find out a power supply input terminal of each cable and a power output terminal of each cable. Furthermore, if the power cables of undivided path are twisted together, that will not easy to untie the power cables when any cable needs to repair or replace it. Thus, there is a requirement of improvement for the second prior-art.

SUMMARY OF THE INVENTION

It is therefore a first object of the invention to provide an extension-type frame for power cable tie, the extension-type frame comprises a first cable frame having a first plane surface, the first plane surface has a plurality of first protruding rings, each of the first protruding rings can form a first cable tie hole; a second cable frame having a second plane surface, the second plane surface has a plurality of second cable tie holes; wherein a plurality of edges of the second cable frame respectively insert into a plurality of rail spaces of the first cable frame, the first and second cable frames can slide each other, the first protruding rings of the first plane surface are located above the second cable tie holes of the second plane surface, thereby preventing interference between the second cable tie holes of the second plane surface and the first cable tie holes of the first plane surface, and therefore the second plane surface can adjust the available quantity of the second cable tie holes.

It is therefore a second object of the invention to provide an extension-type frame for power cable tie, the extension-type frame comprises a first cable frame having a first wall, the first wall has a plurality of first protruding rings, each of the first protruding rings can form a first cable tie hole; a second cable frame having a second wall, the second wall has a plurality of second cable tie holes; wherein a plurality of edges of the second cable frame respectively insert into a plurality of rail spaces of the first cable frame, the first and second cable frames can slide each other, the first protruding rings of the first wall are located at outside of the second cable tie holes of the second wall, thereby preventing interference between the second cable tie holes of the second wall and the first cable tie holes of the first wall, and therefore the second wall can adjust the available quantity of the second cable tie holes.

It is therefore a third object of the invention to provide an extension-type frame for power cable tie, the extension-type frame comprises a first cable frame of right side and a first cable frame of left side, each of the first cable frames have a first plane surface, each of the first plane surfaces have a plurality of first protruding rings, each of the first protruding rings can form a first cable tie hole; a second cable frame having a second plane surface, the second plane surface has a plurality of second cable tie holes; wherein a plurality of edges of the second cable frame respectively insert into a plurality of rail spaces of the first cable frame of right side and a plurality of rail spaces of the first cable frame of left side, the first cable frame of right side and the second cable frame can slide each other, the second cable frame and the first cable frame of left side can slide each other, the first protruding rings of each the first plane surface are located above the second cable tie holes of the second plane surface, thereby preventing interference between the second cable tie holes of the second plane surface and the first cable tie holes of each the first plane surface, and therefore the second plane surface can adjust the available quantity of the second cable tie holes.

First advantages of the invention is, the extension-type frame can use the first cable frame and the second cable frame to relatively slide to adjust the available quantity of the cable tie holes.

Second advantages of the invention is, the first cable frame can use a plurality of first protruding rings to form a plurality of first cable tie holes, the second cable frame has a plurality of second cable tie holes, the first protruding rings are located above the second cable tie holes, thereby preventing interference between the second cable tie holes and the first cable tie holes.

Third advantages of the invention is, the extension-type frame can use the first cable tie holes and the second cable tie holes to fix a plurality of power cables, the extension-type frame can use the first cable tie holes and the second cable tie holes to form a plurality of identifiable paths, user can easy find out a power supply input terminal of each power cable and a power output terminal of each power cable, it is easy to repair or replace any power cable.

Fourth advantages of the invention is, the extension-type frame can use the first cable tie holes and the second cable tie holes to form a plurality of divided paths, thereby preventing a twisting together phenomenon of the power cables.

The above and other objects, features and advantages of the invention will become apparent from the following detailed description taken with the accompanying drawings.

DETAILED DESCRIPTION OF THE INVENTION

Referring to FIGS. 1 to 6, an extension-type frame for power cable tie in accordance with a first embodiment of the invention comprises a first cable frame 10 and a second cable frame 20; the first cable frame has a first plane surface 11, the first plane surface 11 has a plurality of first protruding rings 12, each of the first protruding rings 12 can form a first cable tie hole 13; the second cable frame 20 has a second plane surface 21, the second plane surface 21 has a plurality of second cable tie holes 22; wherein a plurality of edges 24 of the second cable frame 20 respectively insert into a plurality of rail spaces 14 of the first cable frame 10, the first and second cable frames 10, 20 can slide each other, the first protruding rings 12 of the first plane surface 11 are located above the second cable tie holes 22 of the second plane surface 21, thereby preventing interference between the second cable tie holes 22 of the second plane surface 21 and the first cable tie holes 13 of the first plane surface 11, and therefore the second plane surface 21 can adjust the available quantity of the second cable tie holes 22.

Examples of a variation of the first cable frame 10 and a variation of the second cable frame 20; wherein the first cable frame 10 has a first wall 15, the first wall 15 has a plurality of first protruding rings 12, each of the first protruding rings 12 can form a first cable tie hole 13; the second cable frame 20 has a second wall 25, the second wall 25 has a plurality of second cable tie holes 22; the first protruding rings 12 of the first wall 15 are located at outside of the second cable tie holes 22 of the second wall 25, thereby preventing interference between the second cable tie holes 22 of the second wall 25 and the first cable tie holes 13 of the first wall 15, and therefore the second wall 25 can adjust the available quantity of the second cable tie holes 22.

Examples of a fixed location manner of the first and second cable frames 10, 20 and an extension manner of the first and second cable frames 10, 20; wherein the first cable frame 10 has a first side plate 16, the first side plate 16 has at least one first locating hole 17, the second cable frame 20 has a second side plate 26, the second side plate 26 has at least one second locating hole 27; the first and second cable frames 10, 20 can be fixed on a device 30 by the first locating hole 17 and the second locating hole 27, for example, a plurality of screws (not shown) can respectively insert into the first and second locating hole 17, 27 to fix the first and second side plate 16, 26 on the device 30; wherein the device 30 can select from a PDU (Power Distribution Unit), a power distribution apparatus having an AST (Auto Transfer Switch) or a power apparatus.

Figure 1:
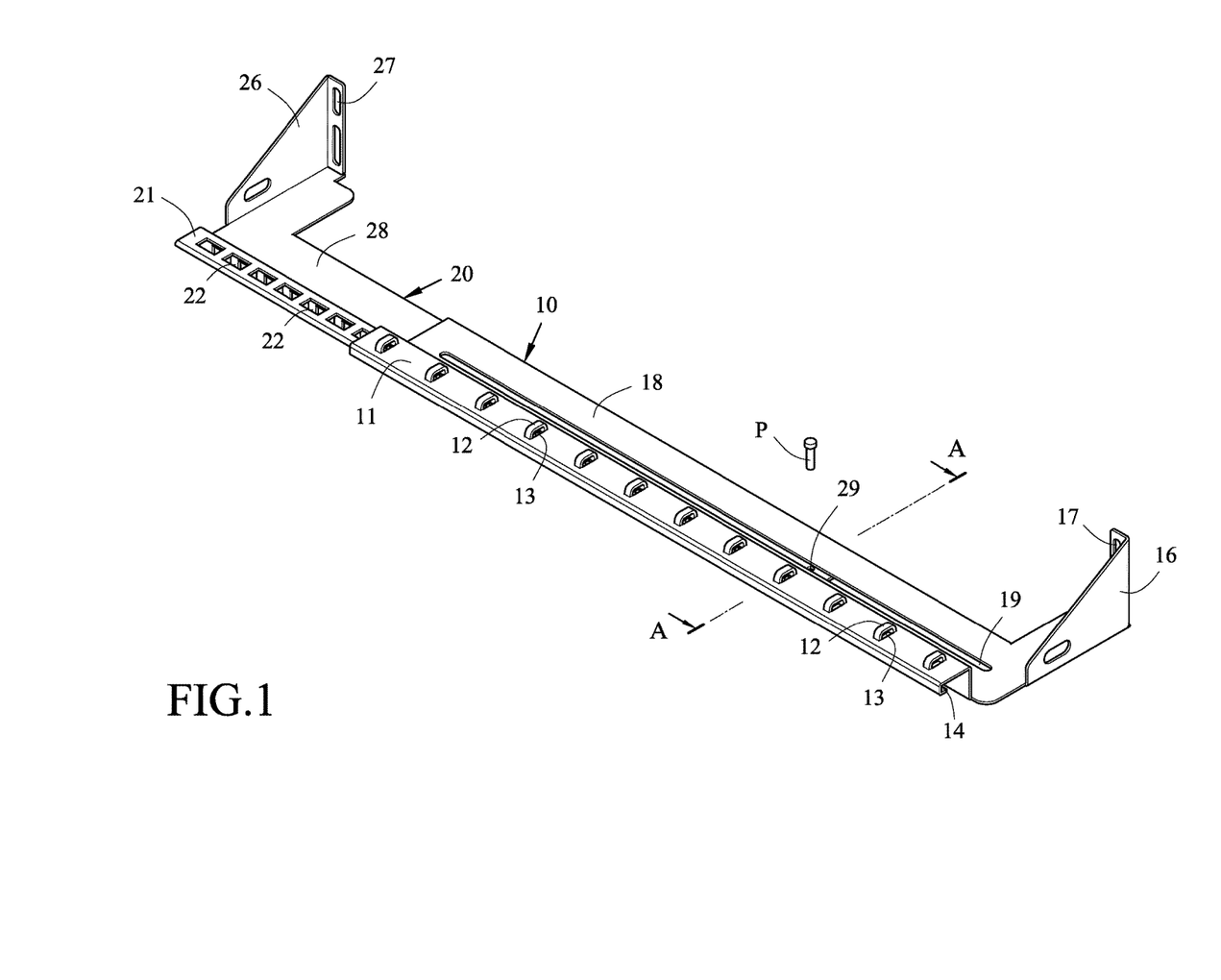
FIG. 1 is a perspective view showing a first preferred embodiment of the invention.
Figure 2:
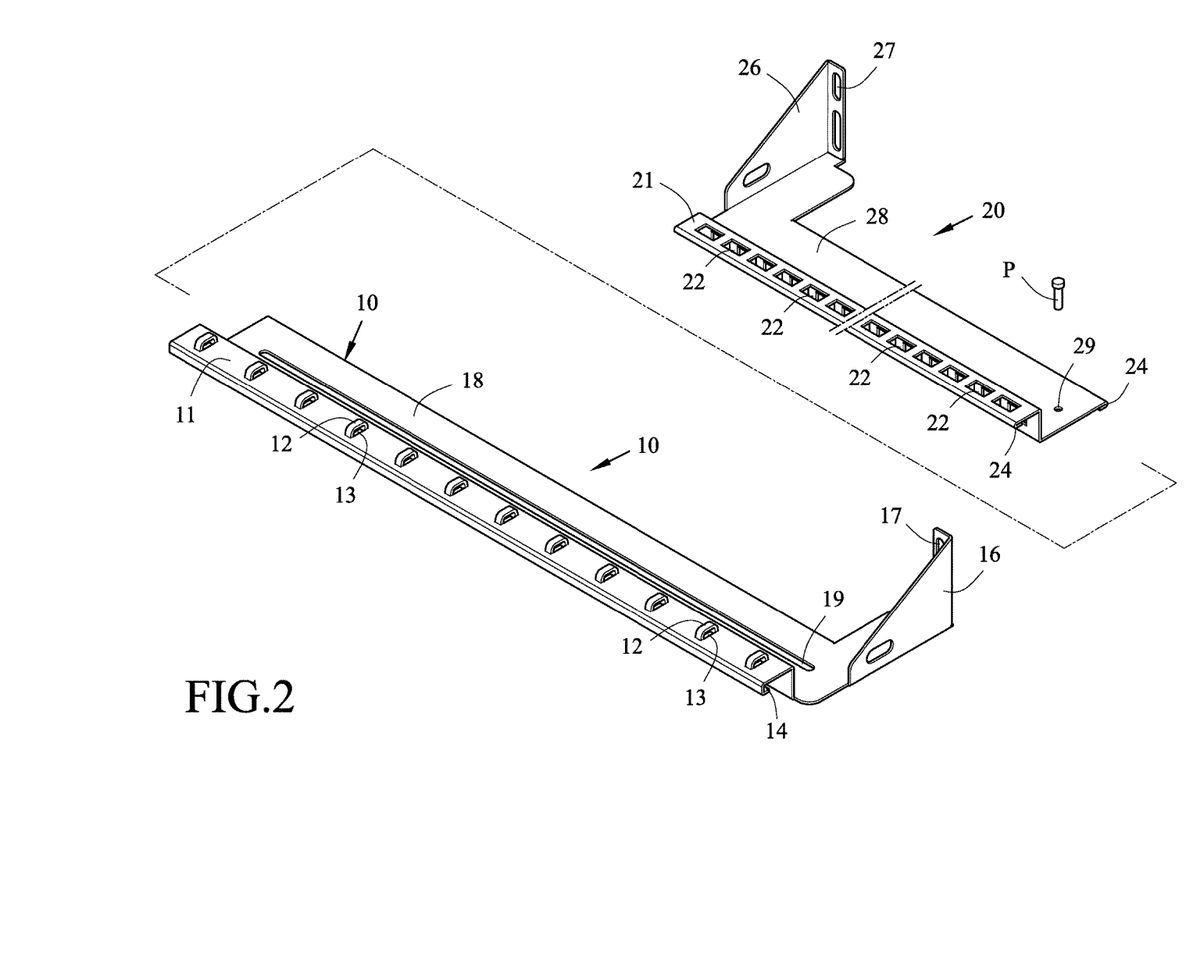
FIG. 2 is an exploded view showing the first preferred embodiment of the invention.
Figure 3:
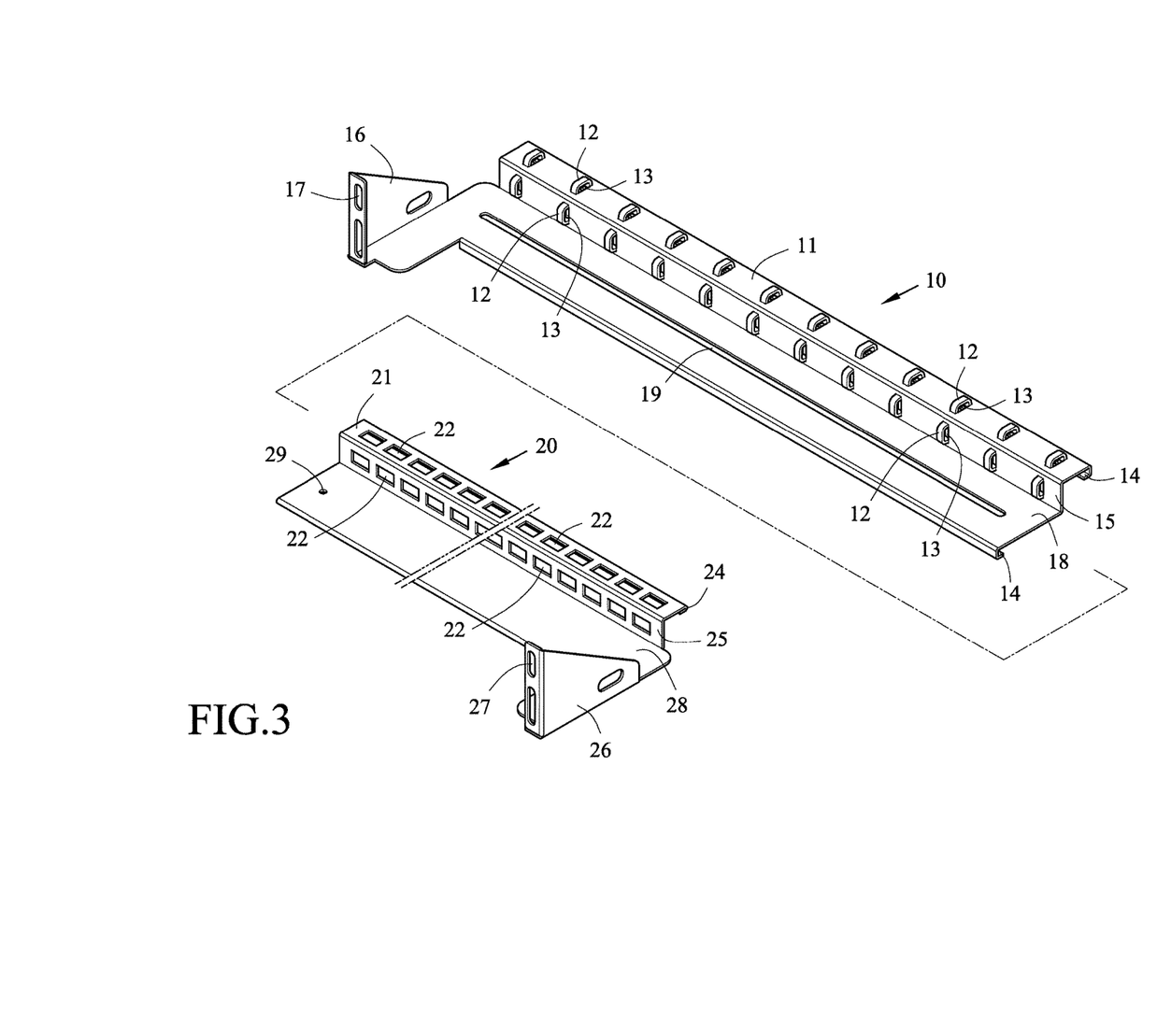
FIG. 3 is another exploded view showing the first preferred embodiment of the invention.
Figure 4:
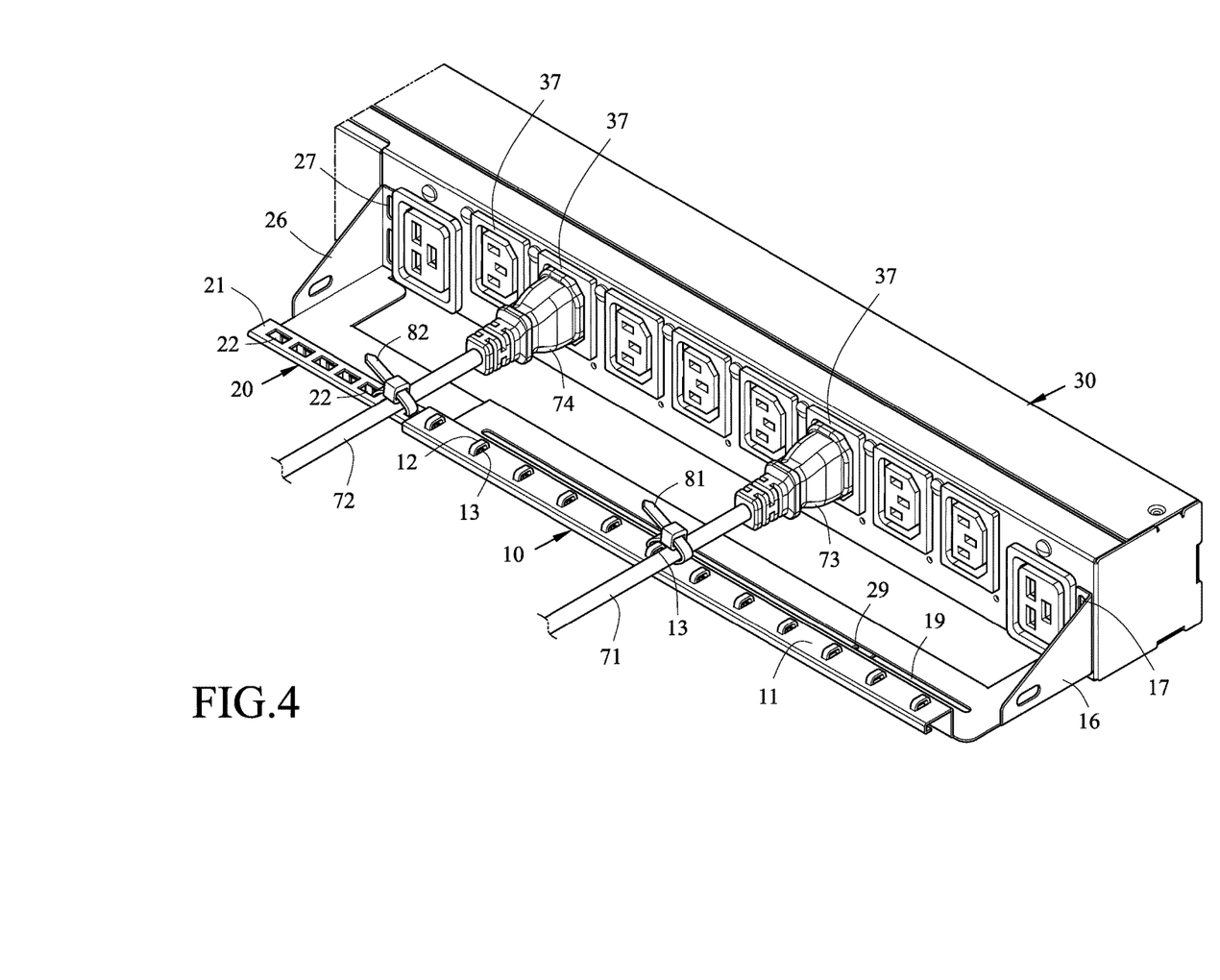
FIG. 4 is a using state view showing the first preferred embodiment of the invention.

Referring to FIG. 4, the first and second cable frames 10, 20 are fixed on a device 30, the device 30 can be provided with a plurality of outlets 37, multiple plugs 73, 74 of power cables 71, 72 can respectively plug into the outlets 37; wherein the power cables 71, 72 can use a plurality of cable ties 81, 82 to respectively fix on the first cable frames 10 and the second cable frame 20, for example, the cable tie 81 can insert through at least one first cable tie hole 13 of the first plane surface 11 to fix the power cable 71 on the first plane surface 11, the cable tie 82 can insert through at least one second cable tie hole 22 of the second plane surface 21 to fix the power cable 72 on the second plane surface 21. Thus, the extension-type frame can use a plurality of the first cable tie holes 13 and a plurality of the second cable tie holes 22 to form a plurality of identifiable paths, user can easy find out a power supply input terminal (not shown) of each of the power cables 71, 72 and a power output terminal (e.g., the plug 73 or the plug 74) of each of the power cables 71, 72, therefore anyone of the power cables 71, 72 can be repaired or replaced.

Figure 5:
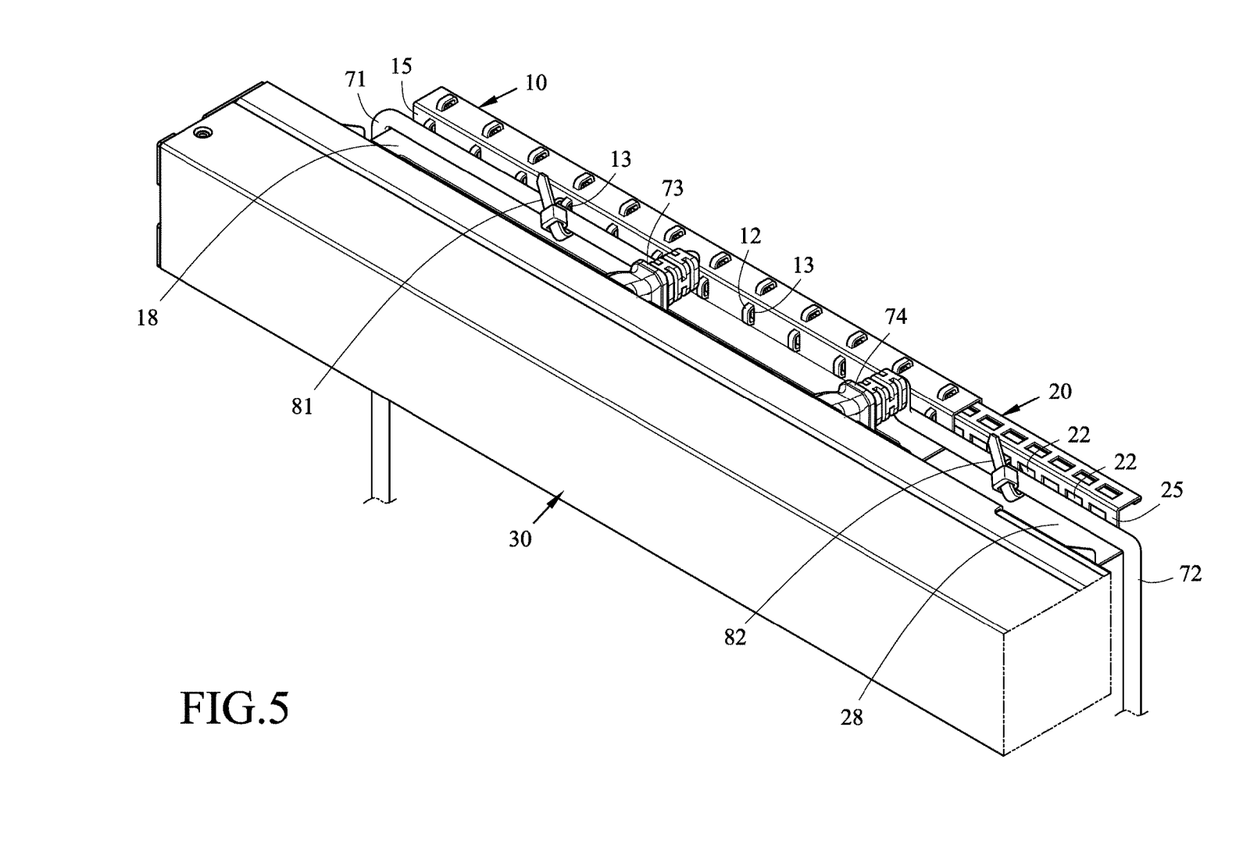
FIG. 5 is another using state view showing the first preferred embodiment of the invention.
Figure 6:
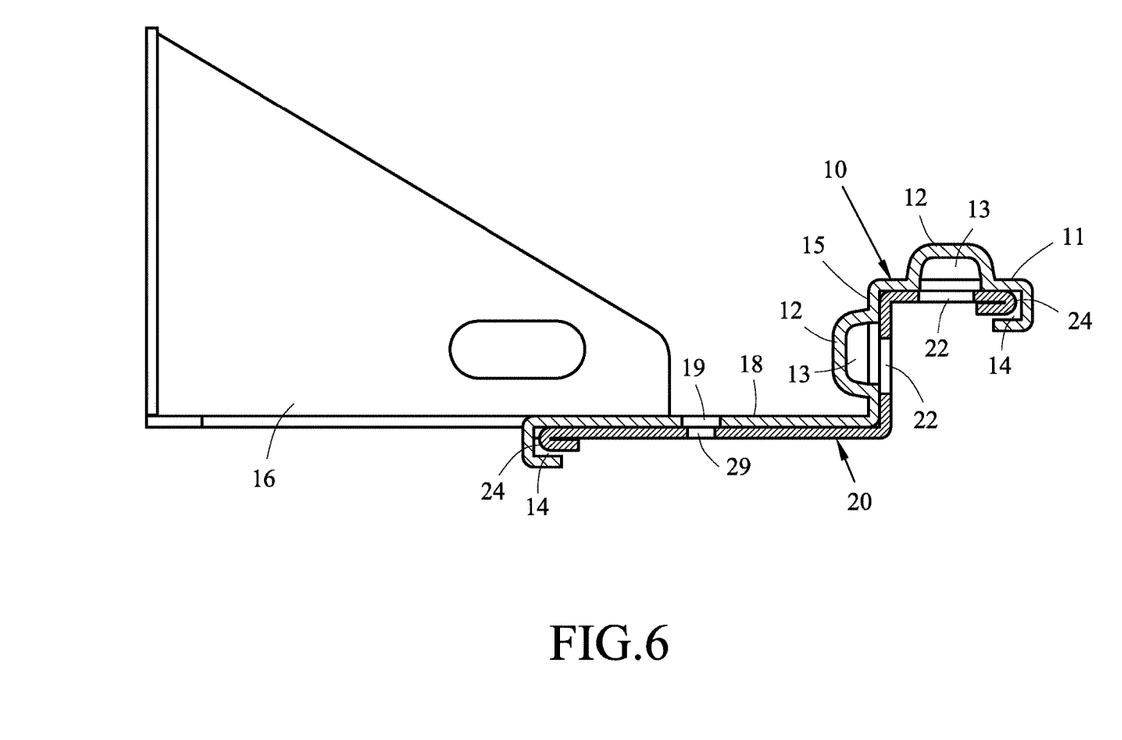
FIG. 6 is a cross-sectional view along a line A-A of FIG. 1 showing the first preferred embodiment of the invention.

Referring to FIG. 5, the first and second cable frames 10, 20 are fixed on the device 30, a plurality of power cables 71, 72 can use a plurality of cable ties 81, 82 to respectively fix on the first cable frames 10 and the second cable frame 20, for example, the cable tie 81 can insert through at least one first cable tie hole 13 of the first wall 15 to fix the power cable 71 on the first wall 15, the cable tie 82 can insert through at least one second cable tie hole 22 of the second wall 25 to fix the power cable 72 on the second wall 25. Thus, the extension-type frame can use a plurality of the first cable tie holes 13 and a plurality of the second cable tie holes 22 to form a plurality of divided paths (the power cables 71, 72 can respectively extend in a different direction), thereby preventing a twisting together phenomenon of the power cables 71, 72. User dose not need to untie all the power cables 71, 72 when repair or replace anyone of the power cables 71, 72.

Figure 7:
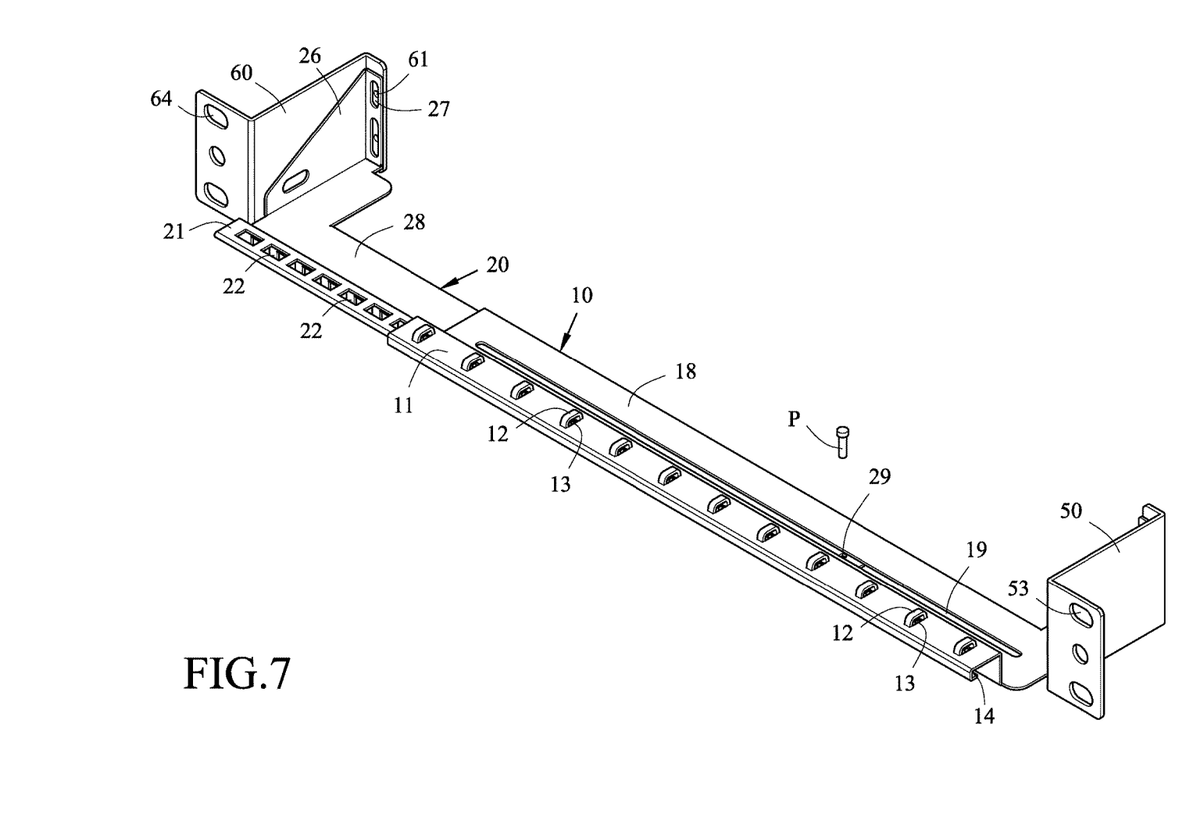
FIG. 7 is a perspective view showing a second preferred embodiment of the invention.
Figure 8:
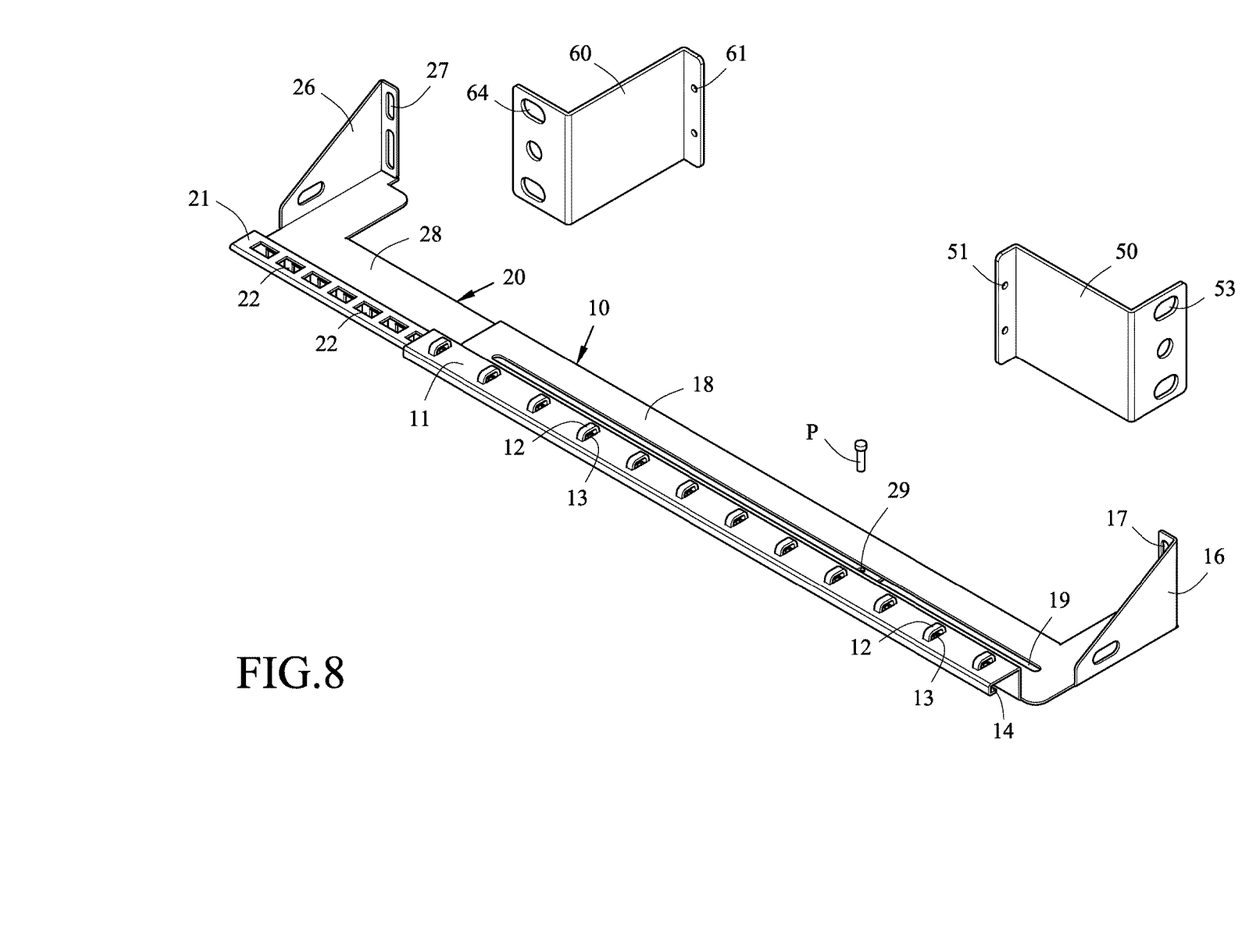
FIG. 8 is an exploded view showing the second preferred embodiment of the invention.
Figure 9:
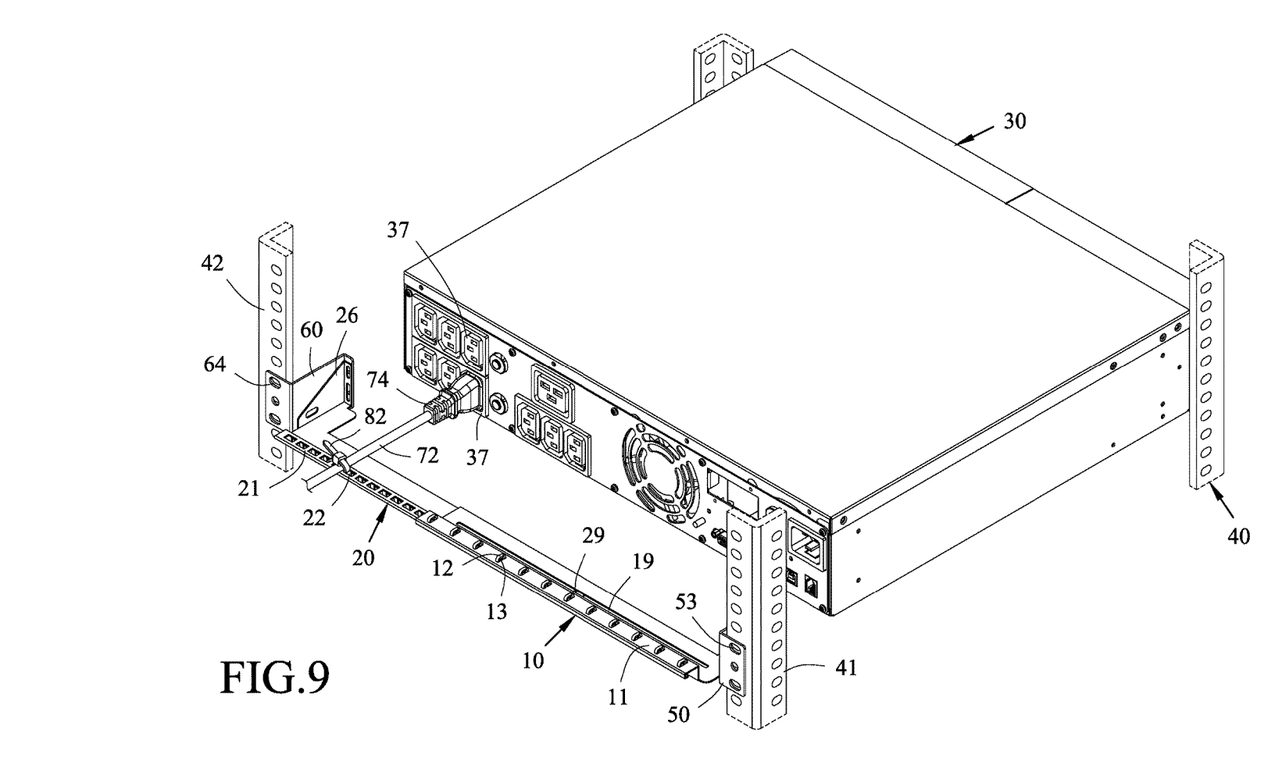
FIG. 9 is a using state view showing the second preferred embodiment of the invention.
Figure 10:
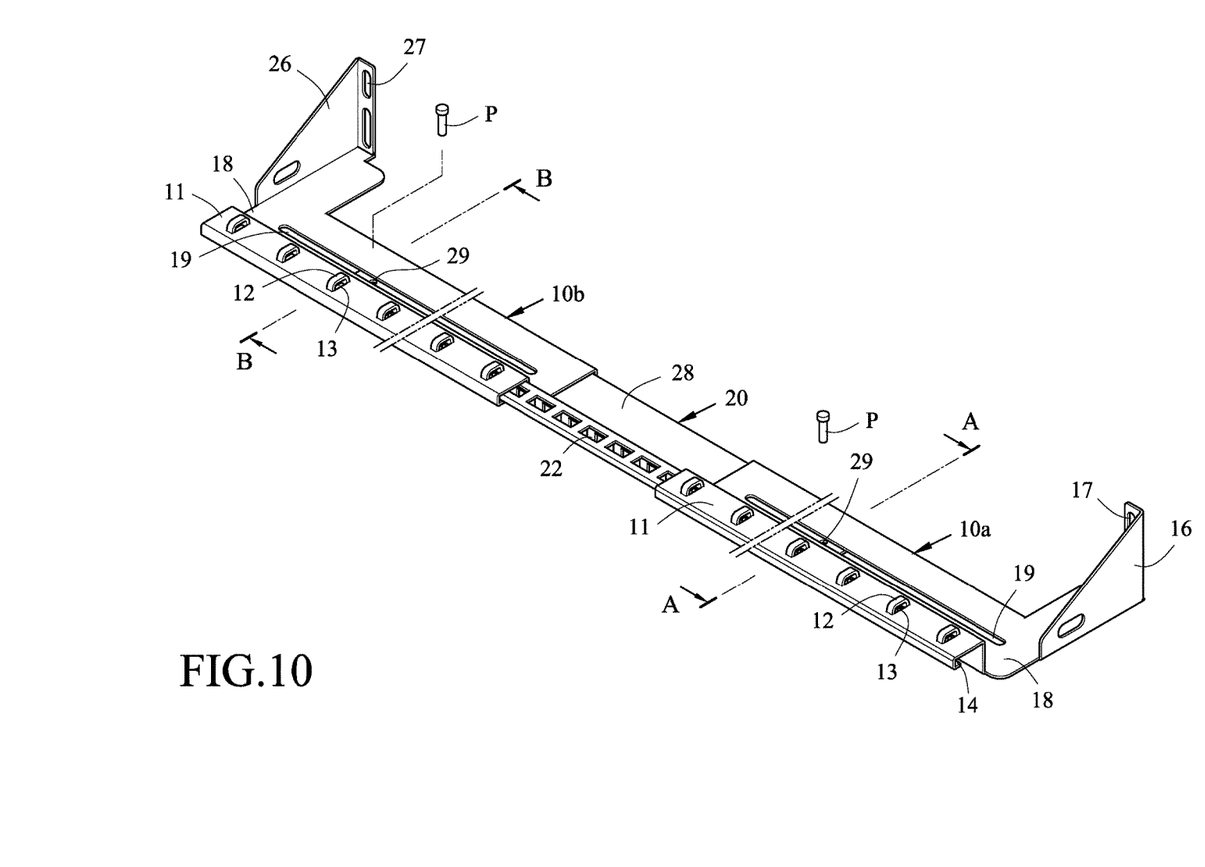
FIG. 10 is a perspective view showing a third preferred embodiment of the invention.

Referring to FIGS. 7 to 9, a second embodiment of the invention system is almost same as the first embodiment of the invention, the difference between them is, the first cable frame 10 has a first side plate 16, the first side plate 16 can fix a first fixing frame 50, for example, the first fixing frame 50 has a screw hole or a through hole 51, at least one screw bolt (not shown) can insert through at least one first locating hole 17 of the first side plate 16 to fix on the screw hole or a through hole 51. Moreover, the second cable frame 20 has a second side plate 26, the second side plate 26 can fix a second fixing frame 60, for example, the second fixing frame 60 has a screw hole or a through hole 61, at least one screw bolt (not shown) can insert through at least one second locating hole 27 of the second side plate 26 to fix on the screw hole or a through hole 61. Furthermore, the first and second fixing frames 50, 60 can fix the first and second cable frames 10, 20 on a rack 40, for example, the first fixing frame 50 has a third locating hole 53, the second fixing frame 60 has a fourth locating hole 64, a plurality of screw bolts (not shown) respectively insert through the third and fourth locating holes 53, 54 to respectively fix the first and second fixing frames 50, 60 on multiple legs 41, 42 of the rack 40.

Examples of a variation of the first and second embodiments, a bottom end of the first wall 15 extended a first platform 18, a bottom end of the second wall 25 extended a second platform 28, the power cables 71, 72 can be supported and contained by the first and second platforms 18, 28; wherein the first platform 18 has an elongated hole 19, the second platform 28 has a through hole 29, a screw bolt or a dowel pin P can be disposed on the elongated hole 19 and the through hole 29, thereby limiting of the slide scope of the second cable frame 20, and thereby preventing escape of the second cable frame 20 from the first cable frame 10.

Figure 11:
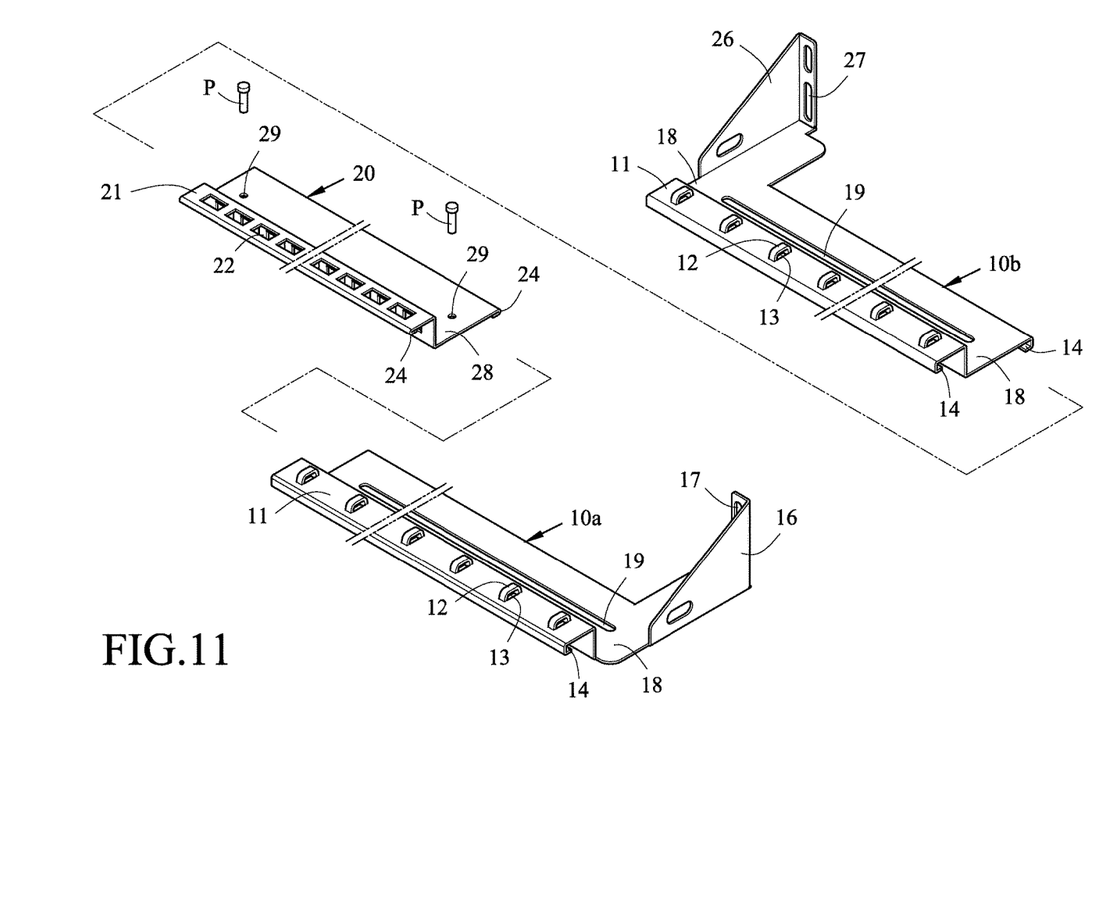
FIG. 11 is an exploded view showing the third preferred embodiment of the invention.
Figure 12:
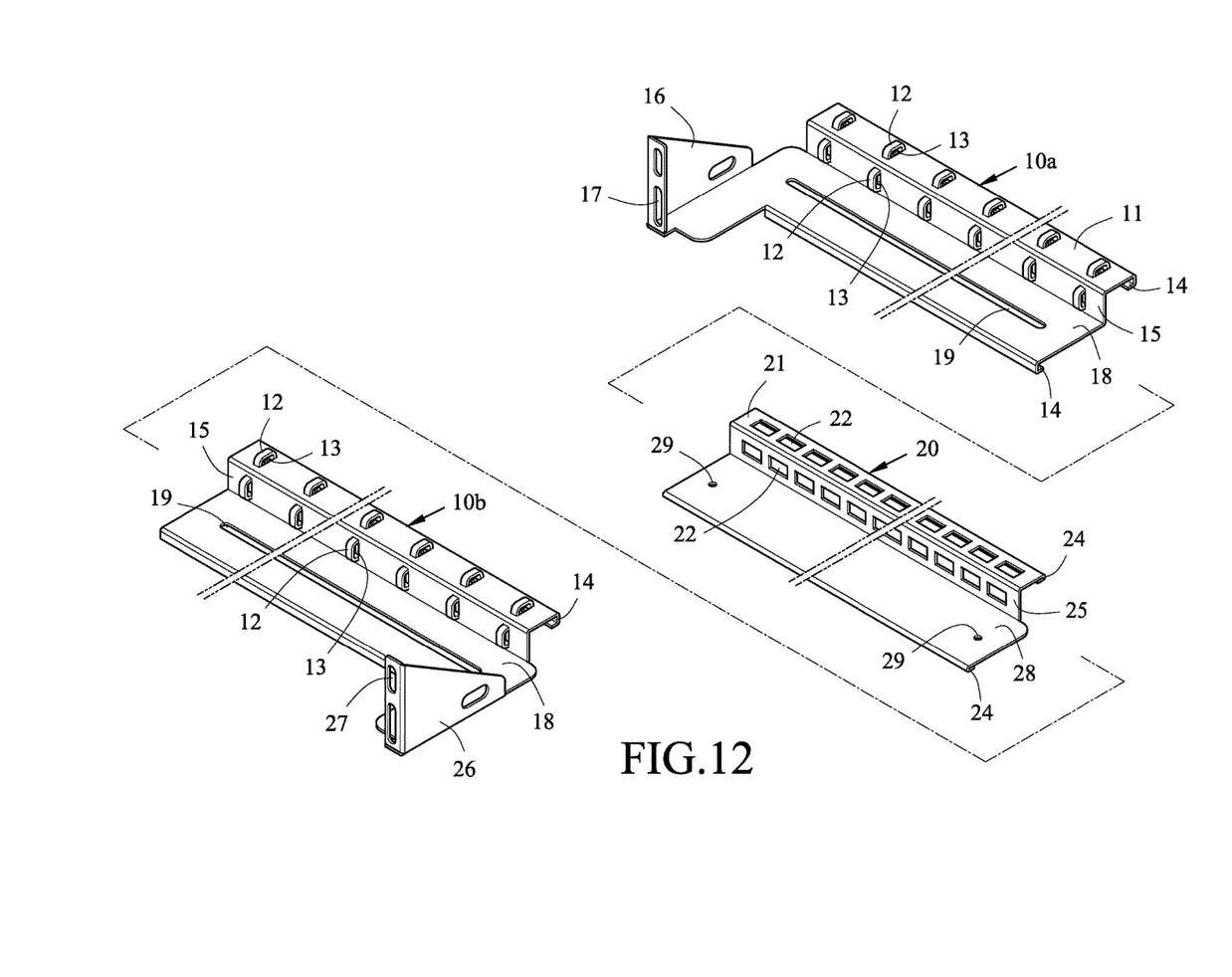
FIG. 12 is another exploded view showing the third preferred embodiment of the invention.
Figure 13:
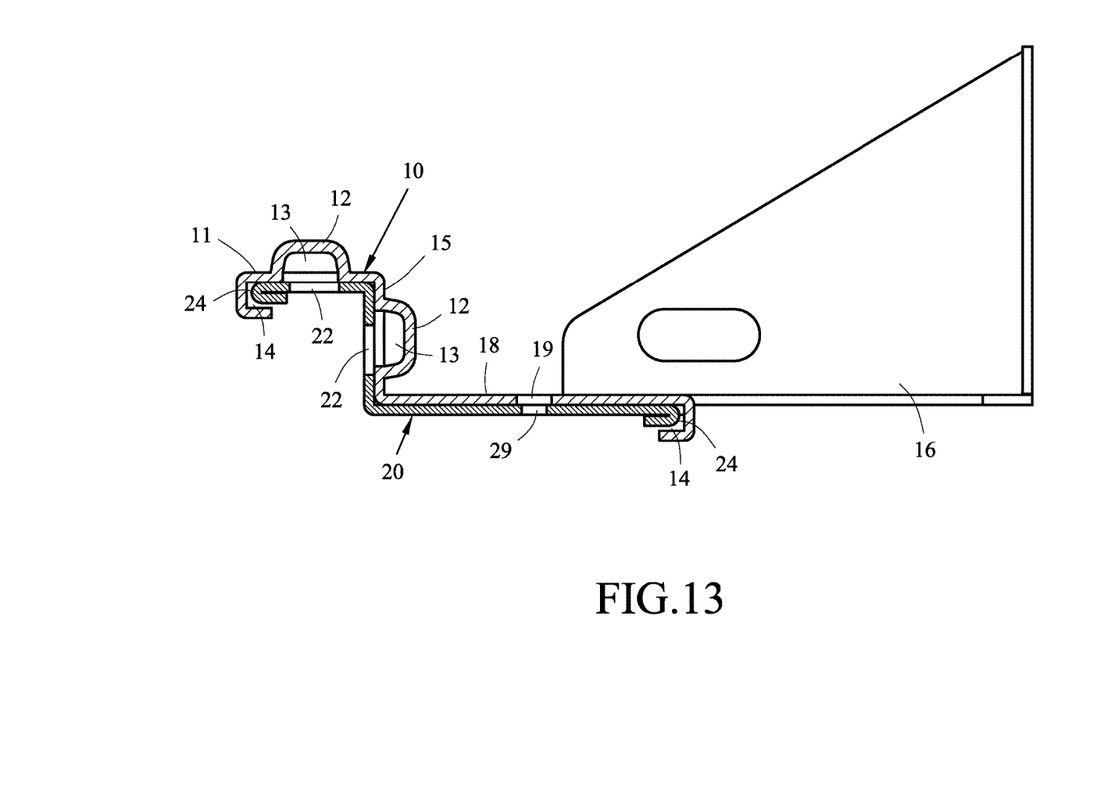
FIG. 13 is a cross-sectional view along a line B-B of FIG. 10 showing the third preferred embodiment of the invention.

Referring to FIGS. 11 to 13, an extension-type frame for power cable tie in accordance with a third embodiment of the invention comprises a first cable frame 10a of right side and a first cable frame 10b of left side, each of the first cable frames 10a, 10b have a first plane surface 11, each of the first plane surfaces 11 have a plurality of first protruding rings 12, each of the first protruding rings 12 can form a first cable tie hole 13; a second cable frame 20 having a second plane surface 21, the second plane surface 21 has a plurality of second cable tie holes 22; wherein a plurality of edges 24 of the second cable frame 20 respectively insert into a plurality of rail spaces 14 of the first cable frame 10a of right side and a plurality of rail spaces 14 of the first cable frame 10b of left side, the first cable frame 10a of right side and the second cable frame 20 can slide each other, the second cable frame 20 and the first cable frame 10b of left side can slide each other, the first protruding rings 12 of each of the first plane surfaces 11 are located above the second cable tie holes 22 of the second plane surface 21, thereby preventing interference between the second cable tie holes 22 of the second plane surface 21 and the first cable tie holes 13 of each of the first plane surfaces 11, and therefore the second plane surface 21 can adjust the available quantity of the second cable tie holes 22.

Examples of a variation of the first cable frame 10a of right side, the first cable frame 10b of left side and the second cable frame 20; wherein each of the first cable frames 10a, 10b have a first wall 15, each of the first walls 15 have a plurality of first protruding rings 12, each of the first protruding rings 12 can form a first cable tie hole 13; the second cable frame 20 has a second wall 25, the second wall 25 has a plurality of second cable tie holes 22; the first protruding rings 12 of each of the first walls 15 are located at outside of the second cable tie holes 22 of the second wall 25, thereby preventing interference between the second cable tie holes 22 of the second wall 25 and the first cable tie holes 13 of each of the first walls 15, and therefore the second wall 25 can adjust the available quantity of the second cable tie holes 22.

Examples of a first fixed location manner of the first cable frames 10a, 10b and a first extension manner of the first cable frames 10a, 10b; wherein the first cable frame 10a of right side has a first side plate 16, the first side plate 16 has at least one first locating hole 17; the first cable frame 10b of left side has a second side plate 26, the second side plate 26 has at least one second locating hole 27; the first cable frames 10a, 10b can use the first and second locating holes 17, 27 to fix on a device. In addition, please refer to the figures and description of the first embodiment for the fixing manner of the first and second locating holes 17, 27.

Examples of a second fixed location manner of the first cable frames 10a, 10b and a second extension manner of the first cable frames 10a, 10b; wherein the first cable frame 10a of right side has a first side plate 16, the first side plate 16 can fix a first fixing frame 50; the first cable frame 10b of left side has a second side plate 26, the second side plate 26 can fix a second fixing frame 60; the first cable frames 10a, 10b can use the first and second fixing frames 50, 60 to fix on a rack. In addition, please refer to the figures and description of the second embodiment for the fixing manner of the first and second fixing frames 50, 60.

Examples of a variation of the third embodiment, the bottom end of each of the first walls 15 extended a first platform 18, the bottom end of the second wall 25 extended a second platform 28, the power cables 71, 72 can be supported and contained by the first and second platforms 18, 28; wherein each of the first platforms 18 has an elongated hole 19, the second platform 28 has a through hole 29, two screw bolts or two dowel pins P can be respectively disposed on the elongated holes 19 and the through hole 29, thereby limiting of the slide scope of the second cable frame 20, and thereby preventing escape of the second cable frame 20 from the first cable frames 10a, 10b.

Figure 14:
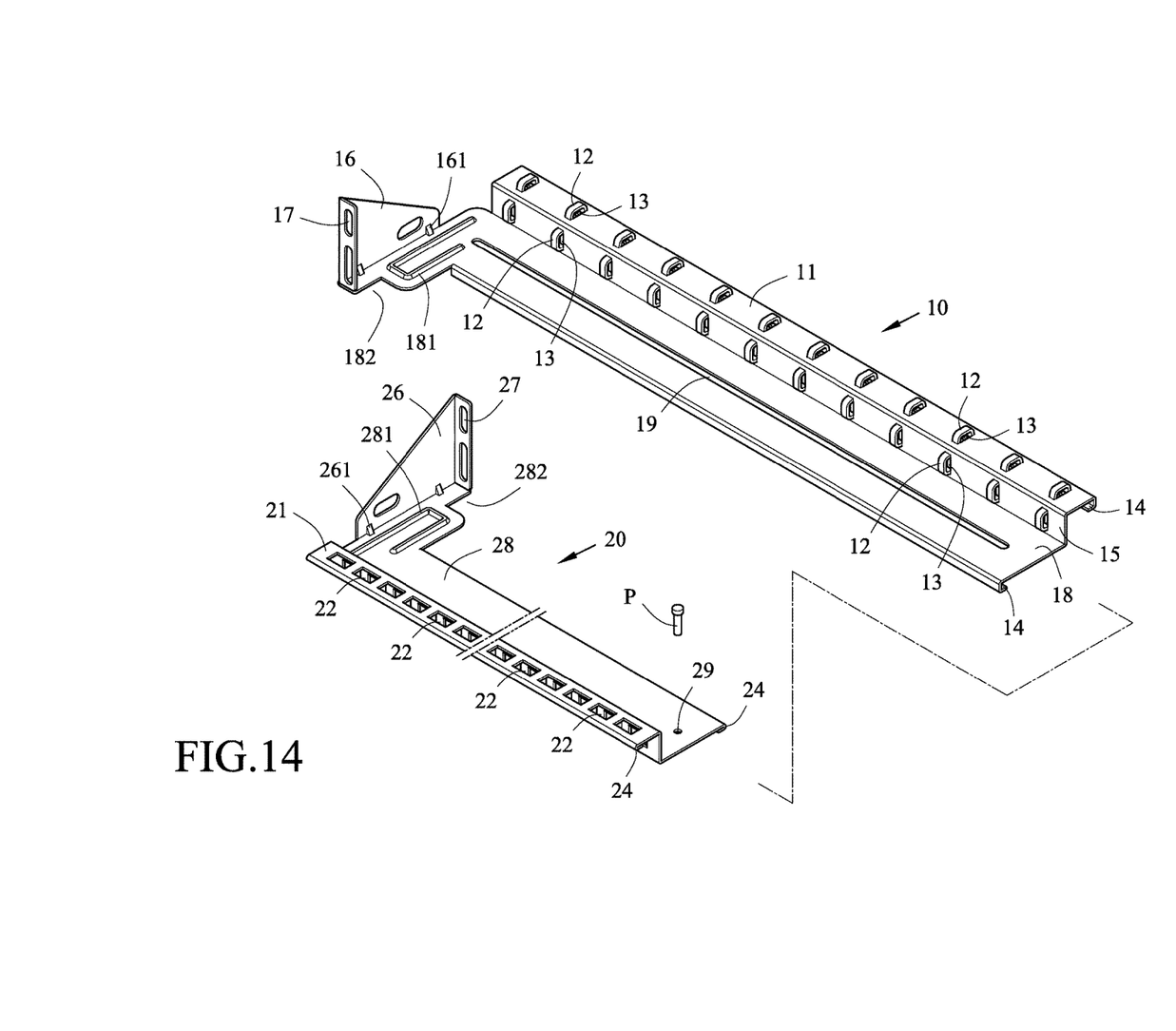
FIG. 14 is an exploded view showing a fourth preferred embodiment of the invention.

Referring to FIG. 14, in fourth embodiment of the invention, examples of a variation of the first and second cable frames 10, 20; wherein a connecting portion of the first side plate 16 and the first platform 18 further has at least one convex portion 161, a connecting portion of the second side plate 26 and the second platform 28 further has at least another convex portion 261, therefore the structural strength of the first and second cable frames 10, 20 can be increased. Moreover, the first platform 18 further has at least one elongated convex portion 181, the second platform 28 further has at least another elongated convex portion 281, therefore the structural strength of the first and second cable frames 10, 20 can be increased. Furthermore, the first platform 18 further has at least one unfilled corner 182, the second platform 28 further has at least another unfilled corner 282, therefore the materials of the first and second platforms 18, 28 can be reduced.

What is claimed is:

1. An extension-type frame for power cable tie, the extension-type frame comprising:
a first cable frame (10) having a first plane surface (11) and a first wall (15), wherein the first plane surface (11) and the first wall (15) have a plurality of first protruding rings (12), and each of the first protruding rings (12) forms a first cable tie hole (13);
a second cable frame (20) having a second plane surface (21) and a second wall (25), wherein the second plane surface (21) and the second wall (25) have a plurality of second cable tie holes (22);
wherein a plurality of edges (24) of the second cable frame (20) respectively inserted into a plurality of rail spaces (14) of the first cable frame (10), the first and second cable frames (10, 20) can slide each other, the first protruding rings (12) of the first plane surface (11) are located above the second cable tie holes (22) of the second plane surface (21), thereby preventing interference between the second cable tie holes (22) of the second plane surface (21) and the first cable tie holes (13) of the first plane surface (11),
wherein the first protruding rings (12) of the first wall (15) are located at outside of the second cable tie holes (22) of the second wall (25), thereby preventing interference between the second cable tie holes (22) of the second wall (25) and the first cable tie holes (13) of the first wall (15), so that the second plane surface (21) and the second wall (25) can adjust an available quantity of the second cable tie holes (22), and wherein a first platform (18) extends from a bottom end of the first wall (15), a second platform (28) extends from a bottom end of the second wall (25), a plurality of power cables (71, 72) can be supported and contained by the first and second platforms (18, 28); the first platform (18) has an elongated hole (19), the second platform (28) has a through hole (29), and a screw bolt or a dowel pin (P) can be disposed on the elongated hole (19) and the through hole (29), thereby limiting of the slide scope of the second cable frame (20), and thereby preventing escape of the second cable frame (20) from the first cable frame (10).

2. The extension-type frame for power cable tie of claim 1, wherein the first cable frame (10) has a first side plate (16), the first side plate (16) has at least one first locating hole (17), the second cable frame (20) has a second side plate (26), the second side plate (26) has at least one second locating hole (27); the first and second cable frames (10, 20) can be fixed on a device (30) by the first locating hole (17) and the second locating hole (27); the device (30) can be a PDU (Power Distribution Unit), a power distribution apparatus having an AST (Auto Transfer Switch) or a power apparatus.

3. The extension-type frame for power cable tie of claim 1, wherein the first cable frame (10) has a first side plate (16), the first side plate (16) can fix a first fixing frame (50), the second cable frame (20) has a second side plate (26), the second side plate (26) can fix a second fixing frame (60), the first and second fixing frames (50, 60) can fix the first and second cable frames (10, 20) on a rack (40).

4. The extension-type frame for power cable tie of claim 1, wherein a connecting portion of a first side plate (16) and the first platform (18) further has at least one convex portion (161), a connecting portion of a second side plate (26) and the second platform (28) further has at least another convex portion (261); the first platform (18) further has at least one elongated convex portion (181), the second platform (28) further has at least another elongated convex portion (281); the first platform (18) further has at least one unfilled corner (182), the second platform (28) further has at least another unfilled corner (282).

5. An extension-type frame for power cable tie, the extension-type frame comprising:
   a first cable frame (10) having a first wall (15), the first wall (15) has a plurality of first protruding rings (12), each of the first protruding rings (12) formed a first cable tie hole (13);
   a second cable frame (20) having a second wall (25), the second wall (25) has a plurality of second cable tie holes (22);
   wherein a plurality of edges (24) of the second cable frame (20) respectively inserted into a plurality of rail spaces (14) of the first cable frame (10), the first and second cable frames (10, 20) can slide each other, the first protruding rings (12) of the first wall (15) are located above the second cable tie holes (22) of the second wall (25), thereby preventing interference between the second cable tie holes (22) of the second wall (25) and the first cable tie holes (13) of the first wall (15), and therefore the second wall (25) can adjust an available quantity of the second cable tie holes (22), and
   wherein a first platform (18) extends from a bottom end of the first wall (15), a second platform (28) extends from a bottom end of the second wall (25), a plurality of power cables (71, 72) can be supported and contained by the first and second platforms (18, 28); the first platform (18) has an elongated hole (19), the second platform (28) has a through hole (29), and a screw bolt or a dowel pin (P) can be disposed on the elongated hole (19) and the through hole (29), thereby limiting of the slide scope of the second cable frame (20), and thereby preventing escape of the second cable frame (20) from the first cable frame (10).

6. The extension-type frame for power cable tie of claim 5, wherein the first cable frame (10) has a first side plate (16), the first side plate (16) has at least one first locating hole (17), the second cable frame (20) has a second side plate (26), the second side plate (26) has at least one second locating hole (27); the first and second cable frames (10, 20) can be fixed on a device (30) by the first locating hole (17) and the second locating hole (27); the device (30) can be a PDU, a power distribution apparatus having an AST or a power apparatus.

7. The extension-type frame for power cable tie of claim 5, wherein the first cable frame (10) has a first side plate (16), the first side plate (16) can fix a first fixing frame (50), the second cable frame (20) has a second side plate (26), the second side plate (26) can fix a second fixing frame (60), the first and second fixing frames (50, 60) can fix the first and second cable frames (10, 20) on a rack (40).

* * * * *